US010686112B2

(12) United States Patent
Sato et al.

(10) Patent No.: US 10,686,112 B2
(45) Date of Patent: Jun. 16, 2020

(54) THERMOELECTRIC CONVERSION MATERIAL AND THERMOELECTRIC CONVERSION ELEMENT USING THE SAME

(71) Applicant: Panasonic Intellectual Property Management Co., Ltd., Osaka (JP)

(72) Inventors: Hiroki Sato, Nara (JP); Hiromasa Tamaki, Osaka (JP); Tsutomu Kanno, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/384,392

(22) Filed: Apr. 15, 2019

(65) Prior Publication Data

US 2019/0348593 A1 Nov. 14, 2019

Related U.S. Application Data

(63) Continuation of application No. PCT/JP2018/044176, filed on Nov. 30, 2018.

(30) Foreign Application Priority Data

May 9, 2018 (JP) ................. 2018-090839

(51) Int. Cl.
*H01L 35/14* (2006.01)
*H01L 35/20* (2006.01)
*H01L 35/22* (2006.01)
*C01G 17/00* (2006.01)

(52) U.S. Cl.
CPC ............ *H01L 35/22* (2013.01); *C01G 17/006* (2013.01); *C01P 2002/72* (2013.01); *C01P 2002/74* (2013.01); *C01P 2006/32* (2013.01); *C01P 2006/40* (2013.01)

(58) Field of Classification Search
CPC ..................................................... H01L 35/22
See application file for complete search history.

(56) References Cited

U.S. PATENT DOCUMENTS

2010/0275963 A1* 11/2010 Yang ...................... H01L 35/22
136/236.1

OTHER PUBLICATIONS

Zhang et al., "Structure and low temperature physical properties of Ba8Cu6Ge40," Journal of Alloys and Compounds 476 (2009) 1-4 (Year: 2009).*

(Continued)

*Primary Examiner* — Angelo Trivisonno
(74) *Attorney, Agent, or Firm* — McDermott Will & Emery LLP

(57) ABSTRACT

The present invention provides a thermoelectric conversion material represented by the following chemical formula (I):

$$Ba_{8+a}Cu_{6-b}Ge_{40+6} \quad (I)$$

wherein
the values of a is not less than 0.1 and not more than 0.47;
the values of b is not less than 0 and not more than 0.43;
the thermoelectric conversion material has a clathrate crystal structure; and
the thermoelectric conversion material is of p-type.
The present invention provides a p-type Ba—Cu—Ge clathrate thermoelectric conversion material having high thermoelectric conversion performance index.

3 Claims, 9 Drawing Sheets

(56) References Cited

OTHER PUBLICATIONS

Johnsen et al., "Crystal Structure, Band Structure, and Physical Properties of Ba8Cu6-xGe40+x ($0 \leq x \leq 0.7$)," Chem. Mater. 2006, 18, 4633-4642 (Year: 2006).*
International Search Report of PCT application No. PCT/JP2018/044176 dated Feb. 27, 2019.
X. Yan et al., "Structural and thermoelectric properties of Ba8Cu5SixGe41-x clathrates", Physical Review B, vol. 87, No. 11, May 13, 2013, pp. 115206-1-115206-9.
Simom Johnsen et al., "Crystal Structure, Band Structure, and Physical Properties of Ba8Cu6-xGe40+x ($0 \leq x \leq 0.7$)", Chemistry of Materials, vol. 18, No. 19, Aug. 17, 2006, pp. 4633-4642.
Hui Zhang et al., "Structure and low temperature physical properties of Ba8Cu6Ge40", Journal of Alloys and Compounds, vol. 476, No. 1-2 (2009), Dec. 25, 2008, pp. 1-4.

* cited by examiner

THERMOELECTRIC CONVERSION MATERIAL AND THERMOELECTRIC CONVERSION ELEMENT USING THE SAME

BACKGROUND

1. Technical Field

The present invention relates to a thermoelectric conversion material and a thermoelectric conversion element using the same.

2. Description of the Related Art

Temperature difference is given between both of ends of the thermoelectric conversion material to generate electromotive force proportional to the temperature difference. This phenomenon that thermal energy is converted into electrical energy is known as Seebeck effect. In the thermoelectric power generation, thermal energy is directly converted into electrical energy using Seebeck effect.

As well known in the art of the thermoelectric conversion material, the performance of the thermoelectric conversion material used for a thermoelectric conversion device is evaluated with a thermoelectric conversion performance index ZT. The thermoelectric conversion performance index ZT is represented by the following mathematical formula (I):

$$ZT = S^2 \sigma T / \kappa \quad (I)$$

where
S represents Seebeck coefficient of the material,
σ represents electrical conductivity of the material, and
κ represents thermal conductivity of the material.

As is the thermoelectric conversion performance index ZT is higher, thermoelectric conversion efficiency is higher. A thermoelectric conversion material in which holes serve as conductive charge carriers exhibits a positive Seebeck coefficient and is of p-type. On the other hand, a thermoelectric conversion material in which electrons serve as conductive charge carriers exhibits a negative Seebeck coefficient and is of n-type.

Since electromotive force generated by a single thermoelectric conversion material is small, a lot of thermoelectric conversion elements are usually connected electrically in series. In particular, it is the most common that p-type thermoelectric conversion materials and n-type thermoelectric conversion materials are aligned alternately as a configuration so as to be connected thermally in parallel. Accordingly, it is beneficial in light of practicality to achieve both p-type and n-type characteristics with one kind of material.

A $Bi_2Te_3$ thermoelectric conversion material has a high thermoelectric conversion performance index ZT and has been in practical use. However, due to rarity of Te, the $Bi_2Te_3$ thermoelectric conversion material is not so common. As just described, a thermoelectric conversion material composed of easily-available elements is expected.

One example of such a material is a clathrate compound composed of Ba, Cu, and Ge. Non-patent Literature 1 discloses that a clathrate compound represented by the chemical formula $Ba_{8.03}Cu_{5.00}Ge_{41.00}$ is of n-type and has a thermoelectric conversion performance index ZT of 0.2 and 0.45 at temperature of 150 degrees Celsius and 400 degrees Celsius, respectively. Non-patent Literature 2 discloses that a clathrate compound represented by the chemical formula $Ba_8Cu_{6-x}Ge_{40+x}$ (0≤x≤0.7) is of n-type.

However, unlike the n-type Ba—Cu—Ge clathrate compound, a p-type Ba—Cu—Ge clathrate compound has a low thermoelectric conversion performance index ZT. As one example, according to Non-patent Literature 3, a p-type clathrate compound represented by the chemical formula $Ba_{8.21}Cu_{6.49}Ge_{39.51}$ has a low thermoelectric conversion performance index ZT of 0.007 at room temperature.

CITATION LIST

Non-patent Literature 1: X. Yan et al., "Structural and thermoelectric properties of $Ba_8Cu_5Si_xGe_{41-x}$ clathrates", Physical Review B, Vol. 87, No. 11, 2013, pp. 115206-1-115206-9.

Non-patent document 2: S. Johnsen et al., "Crystal Structure, Band Structure, and Physical Properties of $Ba_8Cu_{6-x}Ge_{40+x}$ (0≤x≤0.7)", Chemistry of Materials, Vol. 18, No. 19, 2006, pp. 4633-4642.

Non-patent document 3: H. Zhang et al., "Structure and low temperature physical properties of $Ba_8Cu_6Ge_{40}$", Journal of Alloys and Compounds, Vol. 476, No. 1-2, 2009, pp. 1-4.

SUMMARY

An object of the present invention is to provide a p-type Ba—Cu—Ge clathrate thermoelectric conversion material having high thermoelectric conversion performance index.

The present invention provides a thermoelectric conversion material represented by the following chemical formula (I):

$$Ba_{8+a}Cu_{6-b}Ge_{40+\delta} \quad (I)$$

wherein
the values of a is not less than 0.1 and not more than 0.47;
the values of b is not less than 0 and not more than 0.43;
the thermoelectric conversion material has a clathrate crystal structure; and
the thermoelectric conversion material is of p-type.

The present invention provides a p-type Ba—Cu—Ge clathrate thermoelectric conversion material having high thermoelectric conversion performance index.

DETAILED DESCRIPTION OF THE EMBODIMENT

Hereinafter, the thermoelectric conversion material and element according to the embodiment of the present disclosure will be described in more detail.

The thermoelectric conversion material according to the present embodiment is represented by the following chemical formula (I).

$$Ba_{8+a}Cu_{6-b}Ge_{40+b} \quad (I)$$

where the value of a is not less than 0.1 and not more than 0.47; and the value of b is not less than 0 and not more than 0.43.

The thermoelectric conversion material according to the present embodiment has a clathrate crystal structure and is of p-type.

Figure 1:
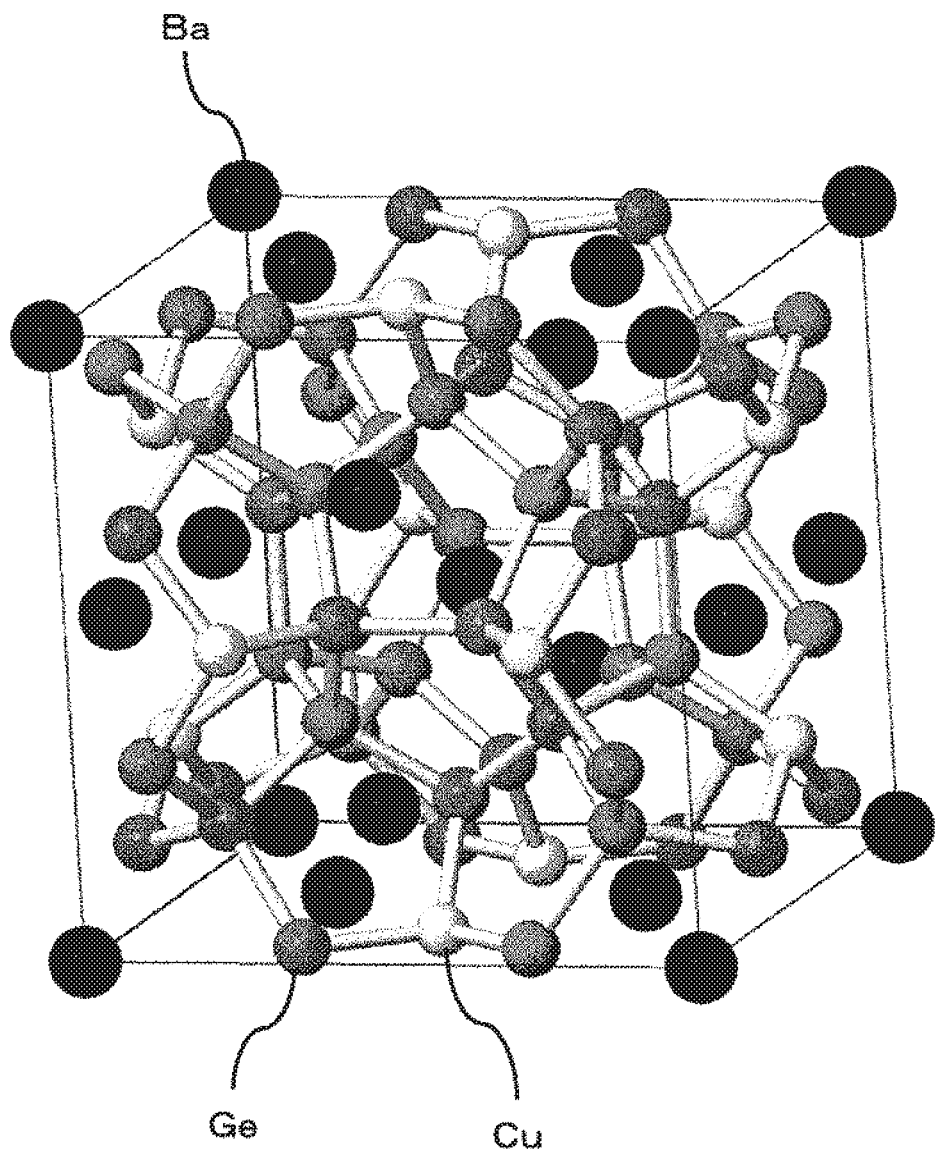
FIG. 1 shows a schematic view of a clathrate crystal structure of the thermoelectric conversion material according to the present disclosure.

The thermoelectric conversion material according to the present embodiment s composed of Ba, Cu, and Ge and has a clathrate crystal structure. FIG. 1 shows a schematic view of the clathrate crystal structure.

As is disclosed in Non-patent Literature 2 and Non-patent Literature 3, the clathrate compound composed of Ba, Cu, and Ge fundamentally has a composition represented by the chemical formula $Ba_6Cu_6Ge_{40}$. As indicated in the chemical formula (I), in the thermoelectric conversion material according to the present embodiment, Ba exists excessively, and a part of Cu is substituted with Ge. The value of a represents an amount of the excessive Ba with regard to the fundamental composition (namely, $Ba_8Cu_6Ge_{40}$). The value of b represents a Ge substitution amount of the part of Cu. The thermoelectric conversion material according to the present embodiment is characterized by both of the following matters (I) and (II).

(I) the value of a is not less than 0.1 and not more than 0.47.

(II) the value of b is not less than 0 and not more than 0.43.

As demonstrated in the inventive examples which will be described later, if the values of a and b fall within these ranges, the thermoelectric conversion material is of p-type and has high thermoelectric conversion performance index. On the other hand, as disclosed in Non-patent Literature 1, Non-patent Literature 2, and Non-patent Literature 3, and as demonstrated in the comparative example which will be described later, in case where at least one of the values of a and b is out of the range, the thermoelectric conversion material is of n-type. Alternatively, in the case, the thermoelectric conversion material is of p-type; however, has low thermoelectric conversion performance index. It is desirable that the value of a is not less than 0.28 and not more than 0.47. It is desirable that the value of b is not less than 0.07 and not more than 0.3. It is more desirable that the value of a is not less than 0.28 and not more than 0.47 and the value of b is not less than 0.07 and not more than 0.3.

A method for synthesizing the thermoelectric conversion material according to the present embodiment comprises a step of melting starting materials of Ba, Cu, and Ge. An example of the melting method is an arc melting method and a high-frequency heating method. It is desirable that the starting materials are melted in an atmosphere filled with an inert gas (e.g., an argon gas) or in a vacuum to avoid the starting materials from being oxidized. Note that in the step of the melting, a part of the starting material may be evaporated or leaked from a vessel. For this reason, the composition ratio of the provided thermoelectric conversion material does not necessarily accord with the composition ratio of the starting materials.

A method for fabricating a thermoelectric conversion member formed of the thermoelectric conversion material according to the present embodiment comprises a step of granulating the thermoelectric conversion material according to the present embodiment synthesized through the step of the melting to provide particles and a step of sintering the particles. In the step of the granulating, the thermoelectric conversion material according to the present embodiment is grounded with a ball mill or a mortar to provide the particles. In the step of the sintering, the particles are sintered by, for example, a spark plasma sintering method or a hot press sintering method. It is desirable that the steps of the granulating and the sintering are also conducted in an atmosphere filled with an inert gas (e.g., an argon gas) or in a vacuum to avoid the thermoelectric conversion material from being oxidized.

Figure 5:
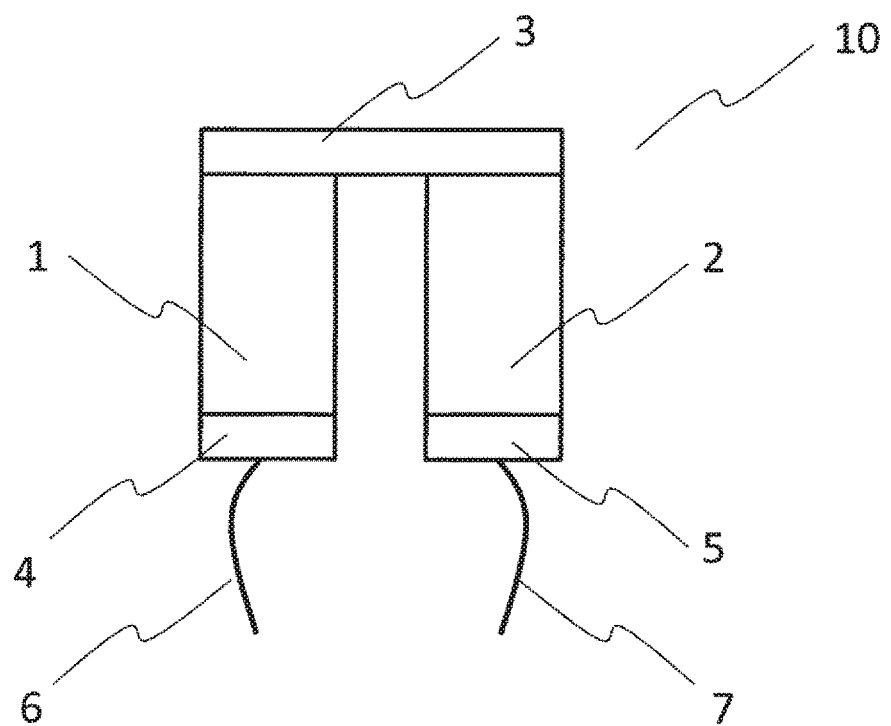
FIG. 5 shows a schematic view of a thermoelectric conversion element according to the present disclosure.

FIG. 5 shows a schematic view of a thermoelectric conversion element 10 according to the present embodiment. The thermoelectric conversion element 10 comprises a p-type thermoelectric conversion part 1, an n-type thermoelectric conversion part 2, a first electrode 3, a second electrode 4, and a third electrode 5. One end of the p-type thermoelectric conversion part 1 and one end of the n-type thermoelectric conversion part 2 are electrically connected to each other through the first electrode 3. Another end of the p-type thermoelectric conversion part 1 and another end of the n-type thermoelectric conversion part 2 are electrically connected to the second electrode 4 and the third electrode 5, respectively. The p-type thermoelectric conversion part 1 is formed of the thermoelectric conversion material according to the present embodiment. An example of a thermoelectric conversion material of the n-type thermoelectric conversion part 2 is a compound represented by the chemical formula $Ba_8Cu_{6-x}Ge_{40+x}$ (where $0 \leq x \leq 0.7$) disclosed in Non-patent Literature 2.

In FIG. 5, a first lead wire 6 and a second lead wire 7 are electrically connected to the second electrode 4 and the third electrode 5, respectively, to output electric power generated due to thermoelectric conversion. The thermoelectric conversion element 10 is fabricated by a known method.

EXAMPLES

The thermoelectric conversion material according to the present disclosure will be described in more detail with reference to the following examples.

Inventive Example 1

(Fabrication Method)

In the inventive example 1, a thermoelectric conversion material represented by the chemical formula $Ba_{8.28}Cu_{5.70}Ge_{40.30}$ was fabricated as below.

As starting materials, Ba particles (purity: over 99%, 3.13 grams), Cu particles (purity: 99.99%, 0.97 grams), and Ge particles (purity: 99.99%, 8.17 grams) were used. A molar ratio of Ba:Cu Ge was 8.2:5.5:40.5. The weight of these starting materials was measured in a globe box filled with an argon gas to avoid Ba from being oxidized in an air. These starting materials were loaded into an arc melting furnace. Then, the inside of the arc melting furnace was filled with an argon gas. The starting materials were heated to 1,000-1,500 degrees Celsius by an arc discharge method. In this way, the starting materials were melted. The starting materials reacted. As a result, an ingot-shaped clathrate compound was provided.

The ingot-shaped clathrate compound was grounded with a mortar in the globe box filled with the argon gas. An inside of a sintering mold (inner diameter: 10 millimeters) formed of graphite was filled with the grounded clathrate compound. The sintering mold was loaded into a spark plasma sintering furnace. Then, the inside of the spark plasma sintering furnace was filled with an argon gas. While a pressure of 30 MPa was applied to the materials included in the sintering mold, a pulse electric current flows through the materials. In this way, the materials were heated at a rate of approximately 20 degrees Celsius/minute. The temperature of the materials was maintained at 800 degrees Celsius for 10 minutes to provide a sintered compact. Finally, the sintered compact was cooled to room temperature. In this way, the thermoelectric conversion material according to the inventive example 1 was provided. The thermoelectric conversion material according to the inventive example 1 was a dense sintered compact of a clathrate compound.

(Identification of Composition Ratio)

Figure 2A:
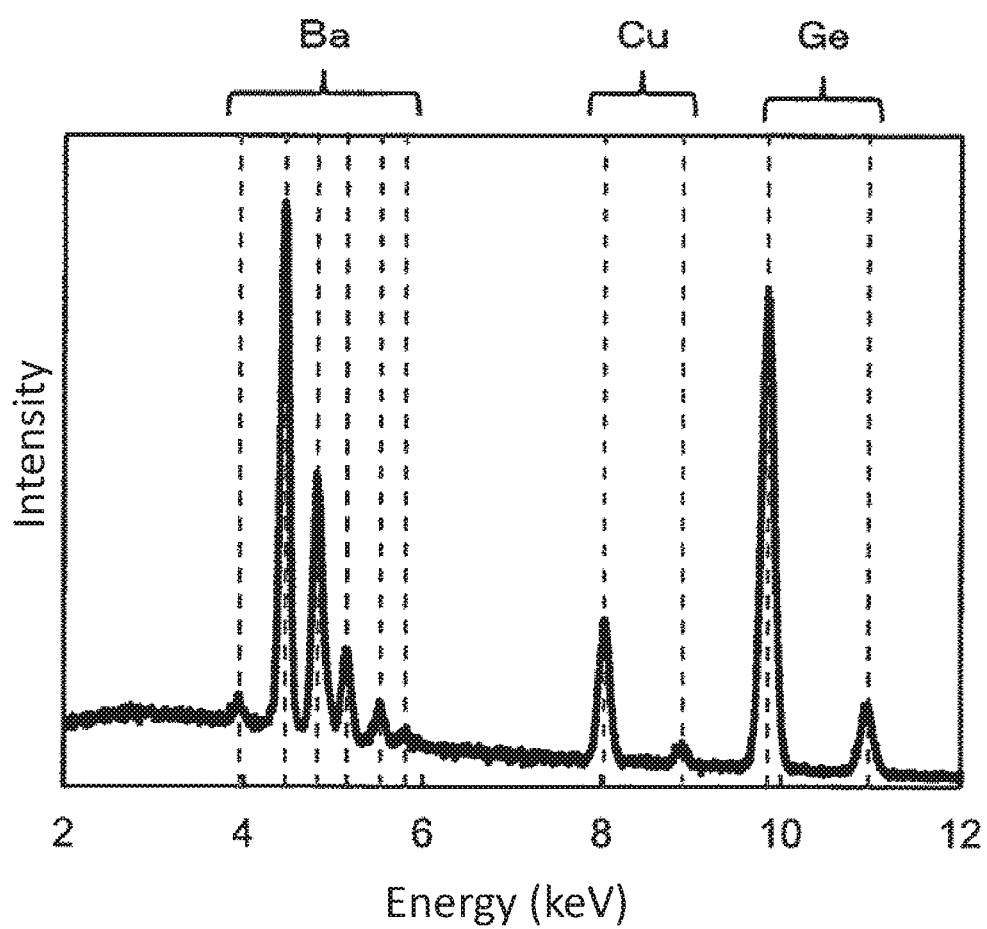
FIG. 2A is a graph showing an analysis result of a thermoelectric conversion material according to the inventive example 1 by an energy dispersive X-ray spectrometry method.

The chemical composition of the thermoelectric conversion material according to the inventive example 1 was analyzed by an energy diffusion X-ray spectrometry method (hereinafter, referred to as "EDX"). FIG. 2A is a graph showing the results thereof. FIG. 2A reveals that the thermoelectric conversion material according to the inventive example 1 had a composition of $Ba_{8.28}Cu_{5.70}Ge_{40.30}$ (namely, a=0.28 and b=0.30 in the chemical formula (I)).

(Observation of Crystal Structure)

Figure 3A:
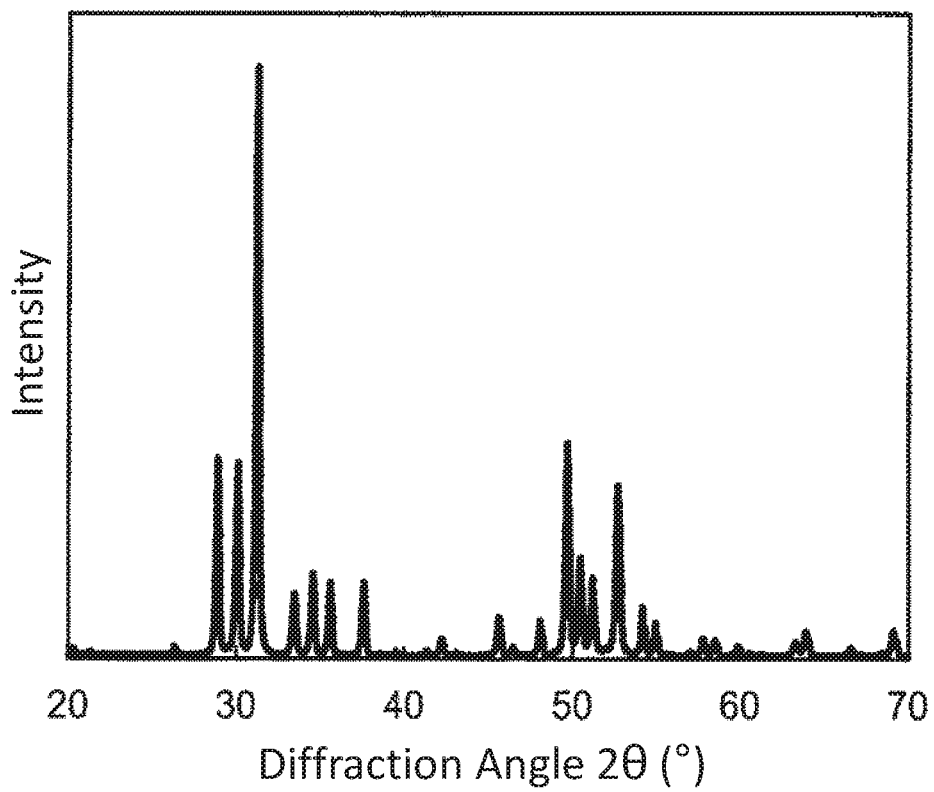
FIG. 3A is a graph showing an analysis result of the thermoelectric conversion material according to the inventive example 1 by an X-ray diffraction method.
Figure 3B:
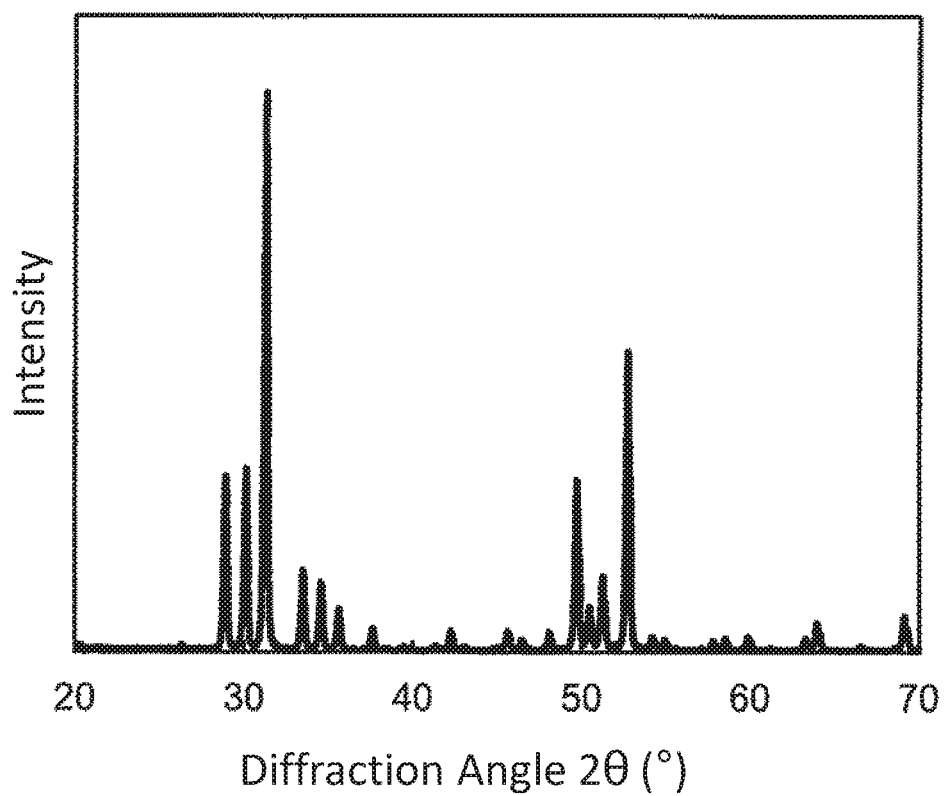
FIG. 3B is a graph showing an analysis result of the thermoelectric conversion material according to the inventive example 2 by an X-ray diffraction method.
Figure 3C:
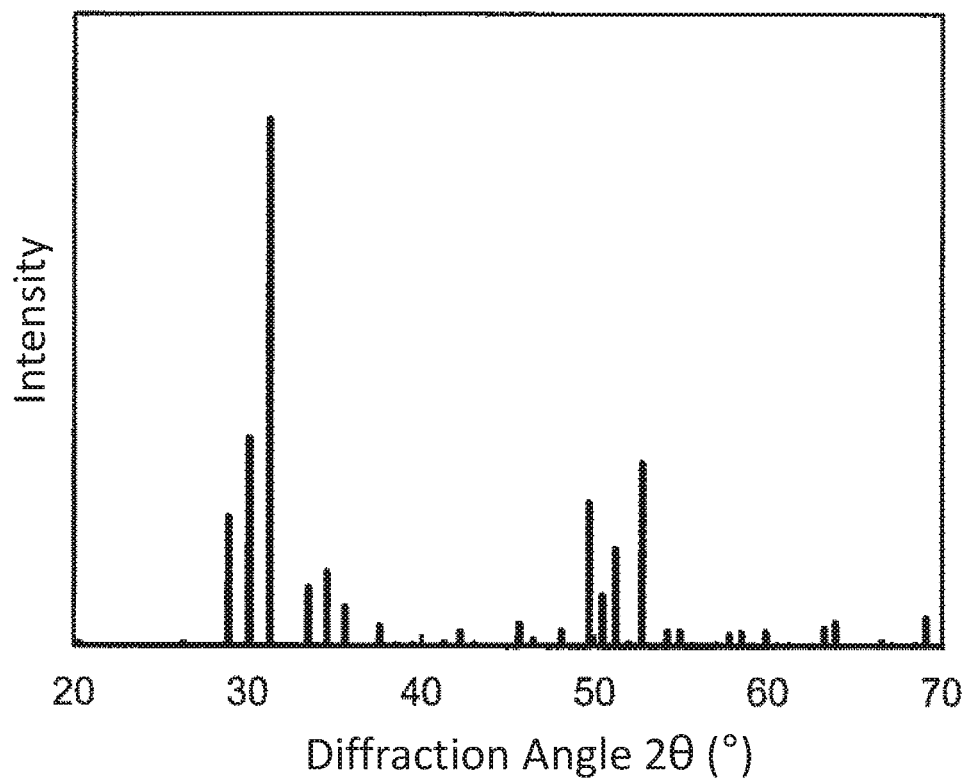
FIG. 3C is a graph showing a simulation results of an X-ray diffraction spectrum of polycrystal of a clathrate compound $Ba_8Cu_6Ge_{40}$.

The crystal structure of the thermoelectric conversion material according to the inventive example 1 was analyzed by an X-ray diffraction method. For the analysis, a CuKα ray (mean wavelength A: 0.15418 nanometers) in which a CuKα₁ (wavelength λ: 0.15406 nanometers) and a CuKα₂ (wavelength λ: 0.15443 nanometers) were mixed at an intensity ratio of 2:1 was used. FIG. 3A is a graph showing the results. FIG. 3C is a graph of a simulation result of an X-ray diffraction spectrum of a polycrystal of a clathrate compound having a composition of $Ba_6Cu_6Ge_{40}$. The diffraction spectrum of the thermoelectric conversion material according to the inventive example 1 accords with the diffraction spectrum of the polycrystal of the clathrate compound. This reveals that the thermoelectric conversion material according to the inventive example 1 consists only of a clathrate compound and is polycrystalline.

(Calculation of Thermoelectric Conversion Performance Index ZT)

The following Table 1 shows the Seebeck coefficient S and the thermoelectric conversion performance index ZT of the thermoelectric conversion material according to the inventive example 1. For the detail of the calculation of the Seebeck coefficient S and the thermoelectric conversion performance index ZT, see U.S. Pat. No. 9,761,779, U.S. patent application Ser. No. 14/847,362 (International Application No: PCT/JP2014/001883), and U.S. Pat. No. 9,853,200, the whole of the contents of which are incorporated herein by reference.

TABLE 1

| Temperature (Kelvin) | Seebeck Coefficient S (µV/Kelvin) | Thermoelectric Conversion Performance Index ZT |
|---|---|---|
| 328 | 196 | 0.255 |
| 374 | 205 | 0.334 |
| 423 | 217 | 0.409 |
| 471 | 221 | 0.462 |
| 519 | 230 | 0.542 |
| 568 | 237 | 0.625 |
| 616 | 236 | 0.623 |
| 664 | 238 | 0.616 |
| 713 | 230 | 0.549 |
| 761 | 216 | 0.455 |

As is clear from Table 1, all the Seebeck coefficients S are positive values. This means that the thermoelectric conversion material according to the inventive example 1 is of p-type. As shown in Table 1, the thermoelectric conversion material according to the inventive example 1 has a high thermoelectric conversion performance index ZT of 0.255 at temperature of 328 Kelvin. Likewise, the thermoelectric conversion material according to the inventive example 1 has a high thermoelectric conversion performance index ZT of 0.625 at temperature of 568 Kelvin.

Figure 4A:
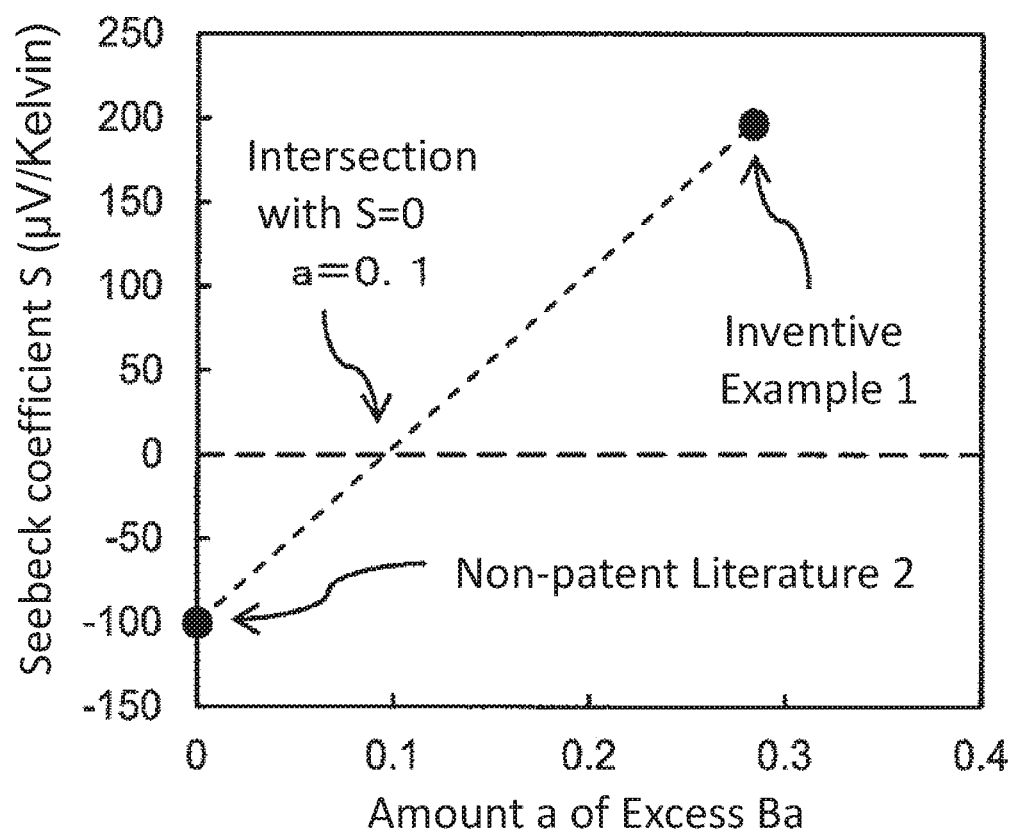
FIG. 4A is a graph showing a relation between a value of an excess Ba amount a and a Seebeck coefficient S of the thermoelectric conversion material $Ba_{8+a}Cu_{6-b}Ge_{40+b}$ according to the present disclosure.

On the other hand, as disclosed in Non-patent Literature 2, the clathrate compound represented by the chemical formula $Ba_8Cu_{5.7}Ge_{40.3}$ (namely, a=0 and b=0.3 in the chemical formula (I)) has a negative Seebeck Coefficient S of −100 µV/Kelvin at temperature of 330 Kelvin. Table 2 shows an interpolation result between the disclosure of Non-patent Literature 2 and the inventive example 1 of the present disclosure. See FIG. 4A.

TABLE 2

| | Amount a of Excessive Ba | Seebeck Coefficient S (µV/Kelvin) |
|---|---|---|
| Inventive Example 1 | 0.28 | 196 |
| Non-patent Literature 2 | 0 | −100 |
| Linear Interpolation Value | 0.1 | 0 |

As is clear from Table 2, the value of a in the chemical formula (I) is required to be not less than 0.1 to provide a p-type property.

Inventive Example 2

In the inventive example 2, an experiment similar to the inventive example 1 was conducted, except that the weight of Ba, Cu, and Ge as the starting materials was 3.34 grams, 1.13 grams, and 8.58 grams, respectively, to provide a thermoelectric conversion material.

Figure 2B:
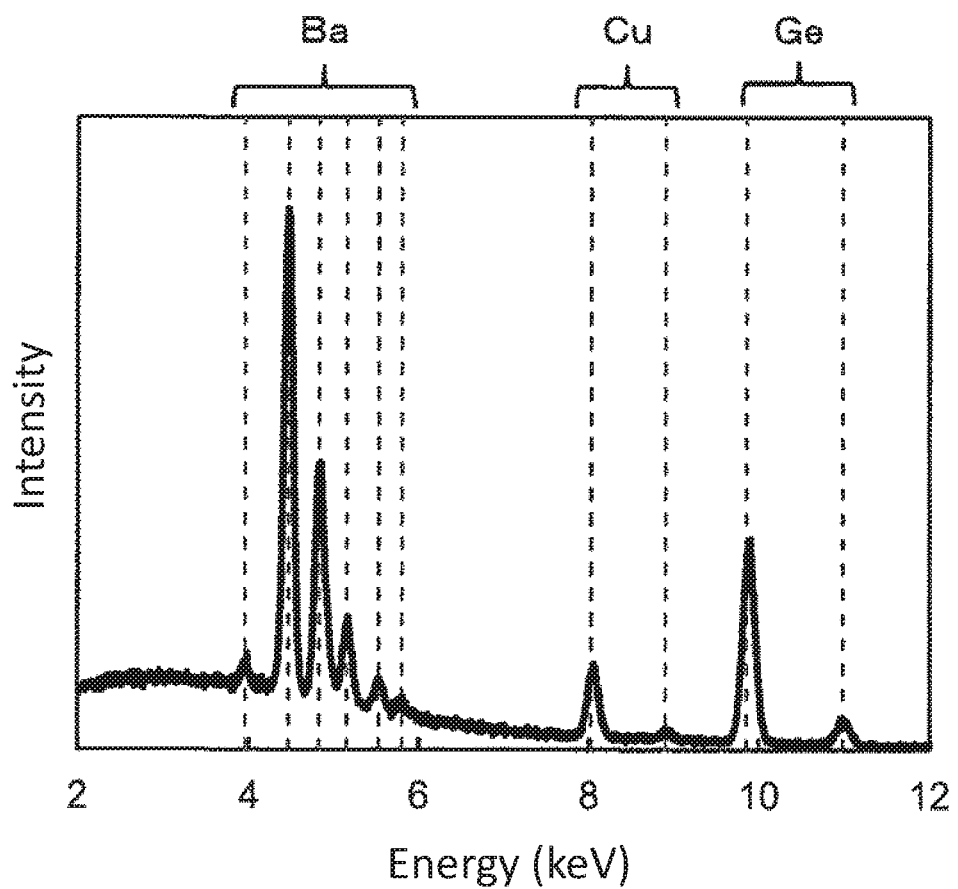
FIG. 2B is a graph showing an analysis result of a thermoelectric conversion material according to the inventive example 2 by the energy dispersive X-ray spectrometry method.

Similarly to the case of the inventive example 1, the chemical composition of the thermoelectric conversion material according to the inventive example 2 was analyzed by the EDX method. FIG. 2B is a graph showing the results thereof. FIG. 2B reveals that the thermoelectric conversion material according to the inventive example 2 has a composition of $Ba_{8.47}Cu_{5.93}Ge_{40.07}$ (namely, a=0.47 and b=0.07 in the chemical formula (I)).

Similarly to the case of the inventive example 1, the crystal structure of the thermoelectric conversion material according to the inventive example 2 was analyzed by the X-ray diffraction method. FIG. 3B is a graph showing the results thereof. The diffraction spectrum of the thermoelectric conversion material according to the inventive example 2 accords with the diffraction spectrum of the polycrystal of the clathrate compound shown in FIG. 3C. This reveals that the thermoelectric conversion material according to the inventive example 2 consists only of a clathrate compound and is polycrystalline.

The following Table 3 shows the Seebeck coefficient S and the thermoelectric conversion performance index ZT of the thermoelectric conversion material according to the inventive example 2.

TABLE 3

| Temperature (Kelvin) | Seebeck Coefficient S (μV/Kelvin) | Thermoelectric Conversion Performance Index ZT |
|---|---|---|
| 330 | 299 | 0.168 |
| 376 | 303 | 0.196 |
| 425 | 314 | 0.245 |
| 473 | 313 | 0.272 |
| 522 | 312 | 0.296 |
| 570 | 297 | 0.296 |
| 618 | 264 | 0.254 |
| 666 | 228 | 0.208 |
| 715 | 192 | 0.166 |
| 763 | 157 | 0.123 |

As is clear from Table 3, all the Seebeck coefficients S are positive values. This means that the thermoelectric conversion material according to the inventive example 2 is of p-type. As shown in Table 3, the thermoelectric conversion material according to the inventive example 2 has a high thermoelectric conversion performance index ZT of 0.168 at temperature of 330 Kelvin. Likewise, the thermoelectric conversion material according to the inventive example 2 has a high thermoelectric conversion performance index of 0.296 at temperature of 570 Kelvin.

On the other hand, according to Non-patent Literature 3, the clathrate compound represented by the chemical formula $Ba_{8.21}Cu_{6.49}Ge_{39.51}$ (namely, the value of b is negative in the chemical formula (I)) has a p-type property; however, a low thermoelectric conversion performance index ZT of 0.007 at temperature of approximately 300 Kelvin. Therefore, for high thermoelectric conversion performance index ZT, the value of b in the chemical formula (I) is required to be positive.

Comparative Example 1

In the comparative example 1, an experiment similar to the inventive example 1 was conducted, except that the weight of Ba, Cu, and Ge as the starting materials was 2.09 grams, 0.695 grams, and 5.28 grams, respectively, to provide a thermoelectric conversion material.

Similarly to the case of the inventive example 1, the chemical composition of the thermoelectric conversion material according to the comparative example 1 was analyzed by the EDX method. As a result, the thermoelectric conversion material according to the comparative example 1 has a composition of $Ba_{8.36}Cu_{5.45}Ge_{40.55}$ (namely, a=0.36 and b=0.55 in the chemical formula (I)).

Similarly to the case of the inventive example 1, the crystal structure of the thermoelectric conversion material according to the comparative example 1 was analyzed by the X-ray diffraction method. As a result, the thermoelectric conversion material according to the comparative example 1 consists only of a clathrate compound and is polycrystalline.

The following Table 4 shows the Seebeck coefficient S and the thermoelectric conversion performance index ZT of the thermoelectric conversion material according to the comparative example 1.

TABLE 4

| Temperature (Kelvin) | Seebeck Coefficient S (μV/Kelvin) | Thermoelectric Conversion Performance Index ZT |
|---|---|---|
| 332 | −164 | 0.061 |
| 375 | −176 | 0.095 |
| 424 | −188 | 0.133 |
| 472 | −197 | 0.159 |
| 521 | −206 | 0.187 |
| 570 | −207 | 0.201 |
| 618 | −199 | 0.188 |
| 666 | −177 | 0.140 |
| 714 | −137 | 0.081 |
| 763 | −84 | 0.031 |

As is clear from Table 4, all the Seebeck coefficients S are negative values. This means that the thermoelectric conversion material according to the comparative example 1 is of n-type. As shown in Table 4, the thermoelectric conversion material according to the comparative example 1 has a low thermoelectric conversion performance index of 0.061 at temperature of 332 Kelvin.

Figure 4B:
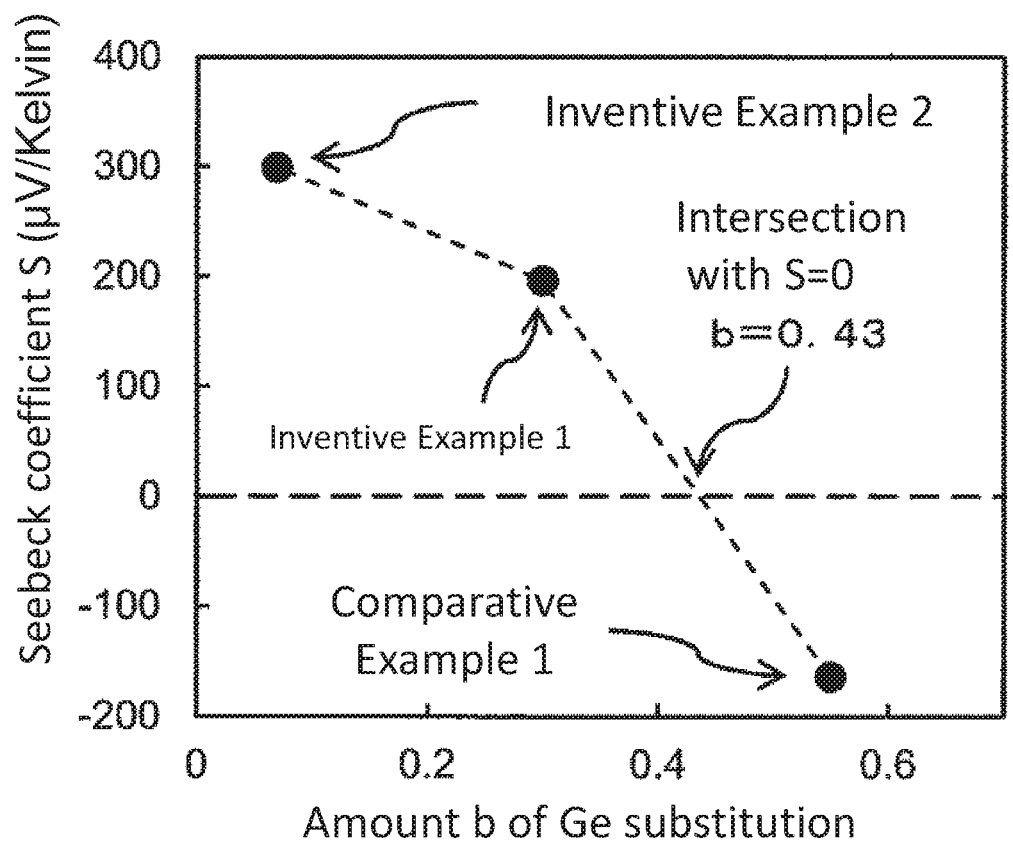
FIG. 4B is a graph showing a relation between a value of a Ge substitution amount b and the Seebeck coefficient S of the thermoelectric conversion material $Ba_{8+a}Cu_{6-b}Ge_{40+b}$ according to the present disclosure.

The following Table 5 shows an interpolation result between the comparative example 1 and the inventive example 1. See FIG. 4B.

TABLE 5

| | Amount b of Ge substitution | Seebeck Coefficient S (μV/Kelvin) |
|---|---|---|
| Comparative Example 1 | 0.55 | −164 |
| Inventive Example 1 | 0.3 | 196 |
| Linear Interpolation Value | 0.43 | 0 |

As is clear from Table 5, the value of b in the chemical formula (I) is required to be not more than 0.43 to provide a p-type property.

INDUSTRIAL APPLICABILITY

The thermoelectric conversion material according to the present invention can be used for a thermoelectric conversion device capable of converting thermal energy into electrical energy.

REFERENTIAL SIGNS LIST

1: p-type thermoelectric conversion part
2: n-type thermoelectric conversion part
3: First electrode
4: Second electrode
5: Third electrode
6: First lead wire
7: Second lead wire
10: Thermoelectric conversion element The invention claime id:
1. A thermoelectric conversion material represented by the following chemical formula (I):

$$Ba_{8+a}Cu_{6-b}Ge_{40+b} \qquad (I)$$

where
the value of a is not less than 0.28 and not more than 0.47;
the value of b is not less than 0.07 and not more than 0.3;
the thermoelectric conversion material has a clathrate crystal structure;

the thermoelectric conversion material is of p-type;
a thermoelectric conversion performance index ZT at 330 Kelvin is not less than 0.168;
and
a thermoelectric conversion performance index ZT at 328 Kelvin is not more than 0.255.

2. A thermoelectric conversion element, comprising:
a p-type thermoelectric conversion part;
an n-type thermoelectric conversion part;
a first electrode;
a second electrode: and
a third electrode,
wherein
one end of the p-type thermoelectric conversion part and one end of the n-type thermoelectric conversion part are electrically connected to each other through the first electrode;
another end of the p-type thermoelectric conversion part and another end of the n-type thermoelectric conversion part are electrically connected to the second electrode and the third electrode, respectively; and
the p-type thermoelectric conversion part is formed of a first thermoelectric conversion material represented by the following chemical formula (I):

$$Ba_{8+a}Cu_{6-b}Ge_{40+6} \qquad (I)$$

where
the value of a is not less than 0.28 and not more than 0.47;
the value of b is not less than 0.07 and not more than 0.3;
the first thermoelectric conversion material has a clathrate crystal structure;
the first thermoelectric conversion material is of p-type;
a thermoelectric conversion performance index ZT at 330 Kelvin is not less than 0.168;
and
a thermoelectric conversion performance index ZT at 328 Kelvin is not more than 0.255.

3. The thermoelectric conversion element according to claim 2, wherein
the n-type thermoelectric conversion part is formed of a second thermoelectric conversion material represented by the chemical formula $Ba_8Cu_{6-x}Ge_{4.0+x}$ (where $0 \le x \le 0.7$).

* * * * *